United States Patent [19]

Gray et al.

[11] Patent Number: 5,452,222
[45] Date of Patent: Sep. 19, 1995

[54] FAST-RISETIME MAGNETICALLY COUPLED CURRENT INJECTOR AND METHODS FOR USING SAME

[75] Inventors: Robert Gray, Arlington; Leedy Ambrose, Manassas, both of Va.; Diane C. Jentilet, Rockville, Md.

[73] Assignee: Ensco, Inc., Springfield, Va.

[21] Appl. No.: 924,554

[22] Filed: Aug. 5, 1992

[51] Int. Cl.⁶ .................................. G09B 23/00
[52] U.S. Cl. ..................... 364/481; 364/580; 376/156; 455/1
[58] Field of Search ............... 364/481, 580; 455/1, 455/68; 378/119; 376/156; 434/218; 250/493.1; 307/106, 112

[56] References Cited

U.S. PATENT DOCUMENTS

| | | | |
|---|---|---|---|
| 2,758,221 | 8/1956 | Williams | 307/88 |
| 3,090,872 | 5/1963 | Thompson | 307/88 |
| 3,103,593 | 9/1963 | Woodland | 307/88 |
| 3,484,619 | 12/1969 | Proud, Jr. | 307/106 |
| 3,832,569 | 8/1974 | Anderson | 307/110 |
| 3,983,416 | 9/1976 | Cronson | 307/260 |
| 4,140,917 | 2/1979 | Weiner | 307/106 |
| 4,317,214 | 2/1982 | Attinello | 455/1 |
| 4,763,062 | 9/1988 | Trzcinski et al. | 324/57 N |
| 4,799,005 | 1/1989 | Fernandes | 324/127 |
| 4,845,378 | 7/1989 | Garbe et al. | 307/106 |
| 4,893,089 | 1/1990 | Villa | 328/233 |
| 4,910,522 | 3/1990 | MacDiarmid et al. | 342/165 |
| 4,990,831 | 2/1991 | Thayer, III | 315/111.01 |
| 5,233,143 | 8/1993 | Hutcherson et al. | 200/144 R |
| 5,253,331 | 10/1993 | Lorenzen et al. | 395/50 |
| 5,297,249 | 3/1994 | Bernstein et al. | 395/156 |
| 5,301,336 | 4/1994 | Kodosky et al. | 395/800 |
| 5,311,067 | 5/1994 | Grothaus et al. | 307/108 |

OTHER PUBLICATIONS

Article Entitled "An Electromagnetic Immunity Diagnostic Tool For Electronic Circuits" by James P. Muccioli and Terry M. North, Chrysler Corporation No Date.

Trippe et al., "Instrumentation Configurations for the Performance of EMP Test Procedures", Seventh International Conference on Electromagnetic Capability, Aug. 28≧31, 1990, pp. 301–307.

Trippe et al., "Instrumentation Conf. for the Performance of HEMP Test Procedures", Int. Symposium on Electromagnetic Compatability Symposium Red., pp. 344–348, Aug. 21–23, 1990.

Tesche et al., "The HEMP Response of an Overhead Power Distribution Line", IEEE Transactions on Power Delivery, vol. 4, No. 3, Jul. 1989, pp. 1937–1944.

Kruse et al., "Flashover Vulnerability of Transmission and Distribution Lines to High-Alt. Electromagnetic Pulse (HEMP)", IEEE/PES 1989 Transmission and Distribution Con., pp. 1164–1169.

Primary Examiner—Kevin J. Teska
Assistant Examiner—Stephen J. Walder, Jr.
Attorney, Agent, or Firm—Sixbey, Friedman, Leedom & Ferguson

[57] ABSTRACT

An electromagnetic test system induces large current pulses in a component of a system under test. The pulse waveform may be selectively varied, and possible waveforms include square wave pulse, double exponential, and damped sinusoid waveforms. In a preferred embodiment, these waveforms are generated by simultaneously triggering a plurality of modular signal injector units having ferrite cores hinged to permit positioning of a system component under test (such as a cable or antenna) along their central axes without disturbing connections of the tested component within its system. The injector units are resonance tuned to induce a particular signal in the component under test when triggered, and the modular construction of the system permits selective connection of different injector units to provide different desired total induced signals.

48 Claims, 12 Drawing Sheets

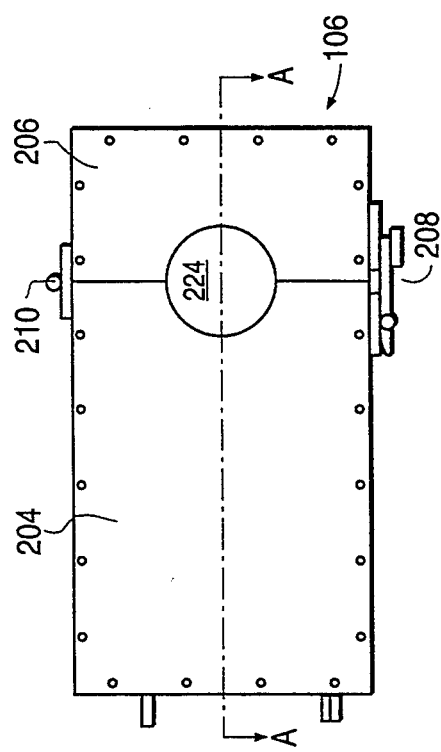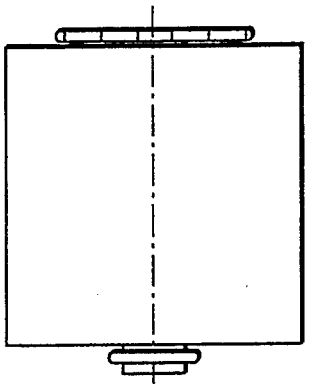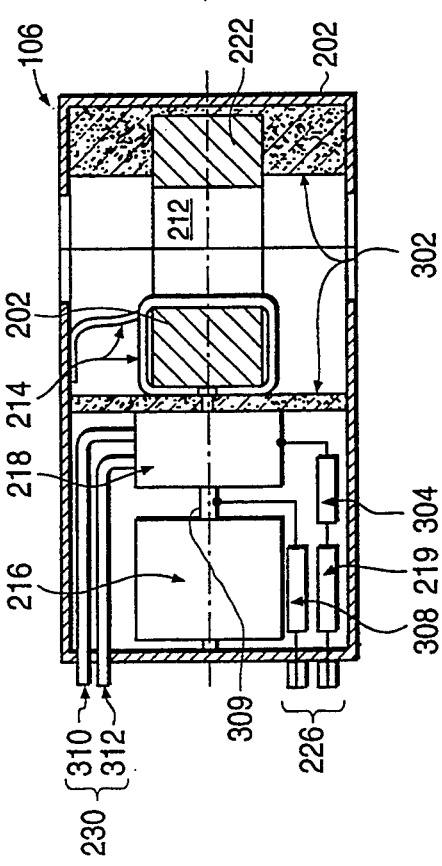

FAST-RISETIME MAGNETICALLY COUPLED CURRENT INJECTOR AND METHODS FOR USING SAME

The U.S. Government has a paid-up license in this invention and the right in limited circumstances to require the patent owner to license others on reasonable terms as provided for by the terms of Contract No. DAAL02-91-C0004 awarded by U.S. Army Research Laboratory.

FIELD OF THE INVENTION

The present invention relates generally to an apparatus for inducing currents in a transmission line and a method for testing systems using the apparatus.

BACKGROUND OF THE INVENTION

In designing electrical and electronic systems, it is desirable to test the response of these systems to externally applied currents and electromagnetic fields which operate to induce currents within transmission lines in the systems. These systems may be exposed to potentially damaging currents and fields in actual use as a result of electrical storms, localized interference, or nuclear detonations, among other causes. The response of these systems to large electromagnetic pulses is therefore of significant concern since it is a common design goal to design systems to absorb such pulses or otherwise resist damage caused by electrical or magnetic fields and their induced currents.

Military specifications in particular require that electrical and electronic systems resist specified external signal injection levels without damage, but many civilian industrial, aeronautical, communications, and vehicular systems have similar design requirements. Specifications for such systems generally define a minimum resistance to damped sinusoid waveforms, double exponential (i.e. voltage spike) waveforms, or square pulse waveforms, depending on the type of external fields that are expected in use. Military specifications emphasize resistance to double exponential current waveforms which are thought to be representative of the effect of an electromagnetic pulse produced by a high-altitude thermonuclear detonation.

Therefore, the inventors believe there is a need for a test apparatus which effectively imitates the effect of such external fields on a cable connecting different parts of an electrical system, which is easily configured for different tests, and which can be readily used without modification of the system under test. However, as far as the inventors are aware, the prior art systems do not fully meet these needs.

Typically, inductive couplers in the prior art consist only of ferrite or powdered iron cores that are energized through cables with waveforms from external waveform generators.

U.S. Pat. No. 4,763,062 to Trzcinski et al. shows a conductive EMI test system which injects wide bandwidth interference signals using direct coupling of the pulse by a wire. However, this system is not designed to produce fast-risetime, high power double exponential or damped sinusoid signals, cannot be readily reconfigured to generate different waveforms, and does not readily couple about a system connecting cable so that the system under test need not be modified or disturbed. Similar apparatus is further described in a paper presented by J. Muccioli and T. North at the IEEE International Symposium on Electromagnetic Compatibility, Cherry Hill, N.J., Aug. 12–16, 1991, titled "An Electromagnetic Immunity Diagnostic Tool for Electronic Circuits."

U.S. Pat. No. 3,103,593 to Woodland discloses a multiple magnetic core device which generates a timed sequence of output pulses using a plurality of coils. The pulse generator disclosed is not designed to generate current pulses for testing systems connected by transmission lines, and the high voltage source components and the inductive coupler elements are not integrated into modular units.

U.S. Pat. No. 3,484,619 to Proud, Jr. shows a system for generating high-power RF pulses, such as for a range detecting system, using a transmission line with gaps.

U.S. Pat. Nos. 3,090,872 to Thompson, 3,983,416 to Cronson, and 2,758,221 to Williams show production of desired waveforms using coils, but for other purposes.

SUMMARY OF THE INVENTION

Therefore, it is a general object of the present invention to provide a novel and improved apparatus for inductively injecting signals into a system under test.

Another general object of the present invention is to provide a novel and improved method for testing the resistance of a system to injected interference signals.

A more specific object of the present invention is to provide a novel and improved apparatus for injecting signals into a system under test in which modular signal injection components are selectively combined to inject a composite signal into the system under test.

A further object of the present invention is to provide a novel and improved apparatus for injecting signals into a system under test in which self-contained modular signal injection units can be selectively combined to produce a desired injected signal.

Another object of the present invention is to provide a novel and improved apparatus for injecting signals into a system under test which uses at least one modular signal injection unit which can be easily coupled to an antenna, cable, or other component of the system under test without disturbing the operation of the system under test.

It is also an object of the present invention to provide a novel and improved apparatus for injecting high power signals into a system under test in which at least one modular signal injection unit is used and a triggering system provides simultaneous triggering of the modules while preventing premature triggering.

Yet another object of the present invention is to provide a novel and improved apparatus for injecting signals into a system under test in which a computer system is provided to control initiation of the test and monitoring of test results.

A further object of the present invention is to provide a novel and improved apparatus for injecting signals into a system under test in which a computer control system provides on-line assistance and instructions to the operator for completing the test according to a predetermined test specification.

Yet another object of the present invention is to provide a novel and improved apparatus for injecting signals into a system under test in which a computer control system provides a multiple window screen display of information useful to the operator.

A further object of the present invention is to provide a novel and improved apparatus for injecting signals into a system under test in which a computer control system uses hypermedia and virtual instrument functions to simultaneously display on a single screen test results and a textual specification of the test.

An additional object of the present invention is to provide a novel and useful apparatus for injecting signals into a system under test in which a computer control system is provided with expert system software programmed with rules for testing according to a predetermined specification to assist the operator in setting up and conducting a test.

A further object of the present invention is to provide a novel and improved method for testing the resistance of a system to injected interference signals using a computer system which is connected to control at least one modular signal injection unit and which is also connected to receive and analyze data defining the response of the system under test to the injected signals.

Another object of the present invention is to provide a novel and improved method for testing the resistance of a system to injected interference signals in which a computer-based testing system provides a multiple window display of information useful to the operator in conducting the test.

A further object of the present invention is to provide a novel and improved method for testing the resistance of a system to injected interference signals in which a computer-based testing system uses hypertext functions to display test specifications and operating instructions.

Yet another object of the present invention is to provide a novel and improved method of testing the resistance of a system to injected interference signals in which a computer-based testing system uses a virtual instrumentation display to provide test results to the operator.

Yet another object of the present invention is to provide a novel and improved method of testing the resistance of a system to injected interference signals using one or more modular injection units which can be combined to inject a desired composite signal into the system under test.

An additional object of the present invention is to provide a novel and useful method for injecting signals into a system under test in which a computer control system is provided with expert system software programmed with rules for testing according to a predetermined specification to assist the operator in setting up and conducting a test.

Other objects and advantages of the present invention will become apparent to those skilled in the art upon review of the specification, drawings, and claims.

Such objects are achieved in a preferred embodiment of the present invention by providing an electromagnetic test system which controllably induces large current flows in a component of a system under test. The waveform induced may be selectively varied, and possible waveforms include square wave pulse, double exponential, and damped sinusoid waveforms. These waveforms may be generated by simultaneously triggering a plurality of modular signal injector units having ferrite cores hinged to permit positioning of a system component under test (such as a cable or antenna) along their central axes without disturbing connections of the tested component within its system. The injector units are resonance tuned to induce a particular signal in the component under test when triggered, and the modular construction of the system permits selective connection of different injector units to provide different desired total induced signals.

BRIEF DESCRIPTION OF THE DRAWINGS

FIGS. 3a, 3b, and 3c are plan views of the modular signal injection unit of FIG. 2, with FIG. 3a being an end view, FIG. 3b being a side sectional view, and FIG. 3c being a top view;

DETAILED DESCRIPTION OF THE PREFERRED EMBODIMENTS

Figure 1:
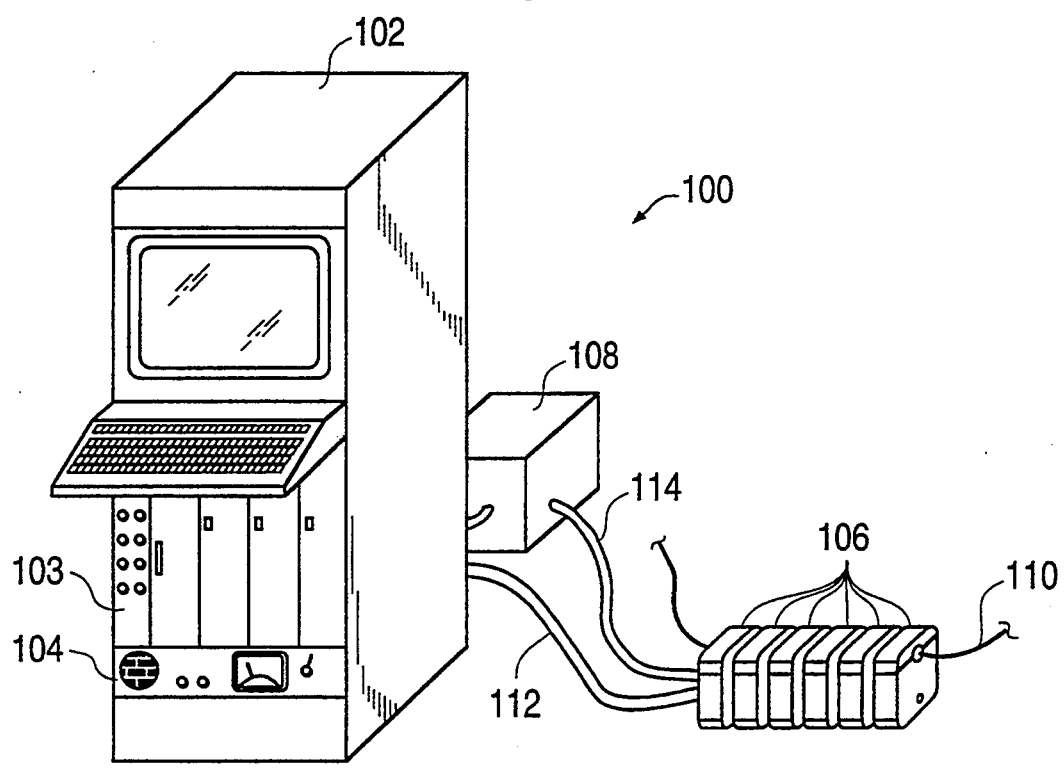
FIG. 1 is a view of a preferred embodiment of the system according to the present invention.

Referring first to FIG. 1, a current injector test system according to a preferred embodiment of the present invention is shown generally at 100. In this embodiment, current injector test system 100 provides a modular system which develops and injects through magnetic coupling a specified electrical waveform (such as a simulated electromagnetic pulse) into a tested component 110 which may be a cable, antenna, grounding conductor, or similar element of a system under test. Preferably, the current induced in test component 110 by current injector test system 100 is adjustable between about 200 and 10,000 amperes.

As shown in FIG. 1, the major components of current injector test system 100 include control unit 102, high voltage power supply 104, at least one injector module 106, and a dielectric gas supply system 108. Injector modules 106 are coupled by cable 112 to both control unit 102 and power supply 104. Cable 112 preferably includes conductors for transmitting high voltage, control, and trigger signals. Injector modules 106 are further coupled by hose 114 to gas supply system 108. Six injector modules 106 are shown in the Figure, although a different number may be used as will be explained in detail later.

Figure 2A:
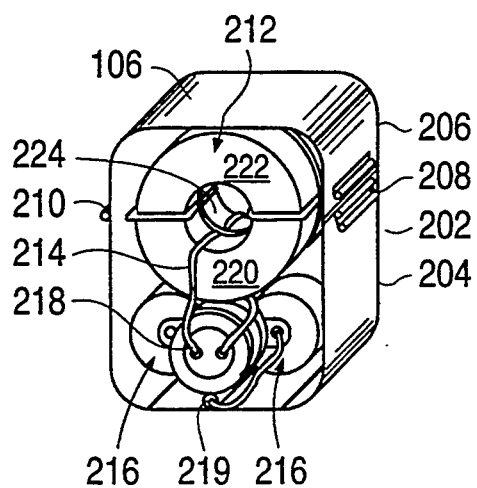
FIGS. 2a and 2b are assembly views of a preferred modular signal injection unit according to the present invention showing internal component layouts and external connector layouts respectively.

In the preferred embodiment, current injector test system 100 provides a wide bandwidth output and produces complex waveforms by using multiple injector modules 106. Referring now to FIG. 2a, each of the injector modules 106 may comprise a metallic housing 202 including a base section 204 and top section 206. Top section 206 may be rotatably attached by hinge 210 to base section 204 and may be selectively latched by latch 208 to base section 204.

The operational components of the preferred injector modules 106 comprise a toroidal ferrite core 212, primary windings 214, capacitors 216, spark gap switch 218, and trigger isolation component 219. Thus, the high voltage waveform shaping components and inductive coupler elements are integrated into a single modular unit.

Primary windings 214 are wrapped about toroidal ferrite core 212 and may be selectively electrically connected through spark gap switch 218 to capacitors 216. Trigger isolation component 219 is connected to a control input of spark gap switch 218 and may be a 100 MΩ resistor. The control input of spark gap switch 218 receives a control input pulse through cable 112 to produce a breakdown voltage inducing completion of a power transmission circuit from the capacitors 216 across the spark gap to primary windings 214. An amplifier for the control pulse is preferably provided as part of the control pulse generator, although individual trigger amplifiers could also be provided in individual injector modules 106. Thus, when spark gap switch 218 is triggered in this manner, a field is generated in the region of the toroidal ferrite core 212 and a current is induced in tested component 110 located in the hole 224 of toroidal ferrite core 212.

Primary winding 214 is designed to operate over a wide range of secondary load impedances, that is, impedances presented by component 110 and anything connected to it. The primary winding 214 is shown in FIG. 2a as a single turn for simplicity, but a plurality of turns may be used to achieve the desired output frequency for the injector module 106.

The capacitors 216 provide a means for both energy storage and waveshaping, and are preferably high voltage low-inductance stored energy capacitors, with capacitance values selected in conjunction with the configuration of primary windings 214 and toroidal ferrite core 212 to achieve a particular desired resonant frequency in the circuit. While two capacitors 216 are shown, what is important is that one or more high quality energy storage means be provided in each injector module 106 to provide a stored electrical energy source for the generation of the injection waveforms. Capacitors with low self inductance and minimum DC voltage ratings of 40 kilovolts will generally be preferred.

Spark gap switch 218 is a gas-pressurized, electrically triggered mid-plane or ring-gap spark-gap switch. Preferably, spark gap switch 218 is a small two-electrode devices with a third trigger element for gap breakdown initialization. Each spark-gap switch will be pressurized to several pounds per square inch with an insulating gas such as super-dry nitrogen or sulphur hexafluoride to prevent high voltage arcing, gap pre-breakdown, and to insure minimum trigger jitter. Each spark gap switch 218 is gas-tight, and has gas line connections to permit gas flow from gas supply system 108 through hose 114 for purging and pressurization. Control of the gas flow, purging, and pressurization is preferably by means of control signals from control unit 102 transmitted to gas supply system 108. Regulators attached to gas cylinders in gas supply system 108 will be used to control the pressure in the spark gap switches 218. Solenoid actuated valves, operated from the control unit, will control the gas flow and purging operations.

The control unit preferably includes a trigger amplifier that amplifies low level (about 10 volt) trigger pulses to produce high amplitude voltage pulses sufficient to initiate an arc at a trigger electrode of the spark-gap switch 218. Electrical power for the trigger amplifier will be supplied from a power supply in the control unit 102.

Injected waveform specifications—amplitude, risetime, and falltime—and toroid properties will determine the specifications of the toroidal ferrite core 212 to be used. Toroidal ferrite core 212 is split along a plane passing through its center and including the central axis of its hole 224. The bottom portion 220 of toroidal ferrite core 212 is fixedly mounted in base section 204 of housing 202, and the top portion 222 of toroidal ferrite core 212 is mounted to rotate with the top section 206 of housing 202 about hinge 210. The surfaces along the split plane are machined to mate closely when injector module 106 is closed so that no substantial air gap is present, and thus the flux transmission properties of toroidal ferrite core 212, when it is closed, are not significantly altered by this splitting of ferrite core 212. Also, holes are provided in housing 202, aligned with the hole 224 in toroidal ferrite core 212, so that a long object may pass through this part of injector module 106.

Thus, injector module 106 can be opened so that the top section 206, bearing the top portion 222 of toroidal ferrite core 212, is separated from bottom section 204 and the bottom portion 220 of ferrite core 212. Injector module 106 can then be closed around component 110 of the system under test. This mechanism permits installation of the injector modules 106 about an existing, connected component 110 of a system to be tested, without disturbing the operation of that system or the connection of tested component 110. Thus, tested component 110 effectively forms a secondary winding of toroidal ferrite core 212.

The output waveshape of each injector module 106 is preferably a damped sinusoid with a specific fundamental frequency needed to produce the desired secondary current. The fundamental frequency of different injector modules 106 used in the same test setup will generally be different, so that a plurality of injector modules 106 with respective predetermined different fundamental frequencies are used in parallel and triggered simultaneously by a signal to spark gap switch 218 to induce a desired additive output waveform.

The use of multiple toroidal cores to produce the total desired waveform output is advantageous not only because the modules can be combined in different manners to form desired waveforms, but also because the use of multiple cores lowers the primary inductance (necessary for high frequency output modules) and matches the output module to a wider range of secondary impedances. The secondary impedance is typically a cable over ground and the impedances encountered may vary greatly in magnitude.

It has been determined analytically that a double exponential secondary current can be produced by simultaneous injection of several damped sinewaves. Proper spacing of the fundamental frequencies of the damped sinewaves is necessary to develop the double exponential secondary current. The capacitors 216, ferrite core 212, and primary winding 214 together make up a tuned circuit, the fundamental frequency of which may be controlled by proper component selection. The number of injector modules 106 also contributes to the production of the desired waveform, in that fewer injector modules 106 are required to make a simpler waveform and a larger number are required to additively construct more complex waveforms. For example, only a single injector module 106 is used to produce a damped sine wave output. Six injector modules 106 are preferred to produce a very fast rise time (less than 10 nanoseconds) double exponential signal with a comparatively long fall time (first crossover point in excess of 100 nanoseconds). This signal form is particularly useful in military specification testing. However, fewer modules could be used for the double exponential signal if greater rise times and relatively shorter fall times (compared to rise times) are acceptable. As many as 12 or more injector modules 106 might be used in producing certain highly complex waveforms.

Figure 2B:
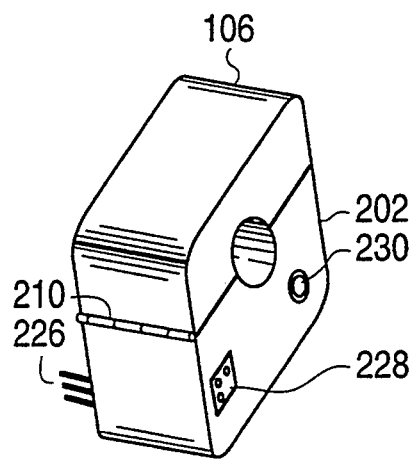

In a particularly preferred embodiment of injector module 106, as shown in FIG. 2b, housing 202 is provided with appropriate connectors on each side, including for example male connector 226 on one side and female connector 228 on the opposite side. Connectors 226 and 228 are located on the sides of injector module 106 proximate to adjacent injector modules 106. The pins of connectors 226 and 228 respectively are connected internally to the injector module 106 in a pin-to-pin fashion, so that injector modules 106 can be "stacke" together with the adjoining connectors mated to operatively connect each of the injector modules 106 in a stack to the same high voltage, amplifier power, trigger control, and other desired sources from control unit 102 (shown in FIG. 1). Internally to the injector module 106, these connections between connectors 226 and 228 are tapped to provide high voltage, trigger voltage, amplifier power, and any other desired power or signal sources to the internal components of injector module 106. Referring briefly again to FIG. 1, cable 112 is preferably provided with a connector which mates with the endmost injector module 106 to provide a single connection for all the injector modules to control unit 102. A suitable plug or cover is provided for the exposed connector 226 or 228 of the injector module 106 farthest from the connection to cable 112 to prevent leakage, shorting, and contact by personnel with the connector pins. Thus, the injector modules 106 plug together to form a signal and power bus connecting all of the injector modules 106 to control unit 102.

Similarly, a "gas bus" may be formed by providing similarly mating gas connections 230 between injector modules 106 to make a single connection at the end to gas hose 114 connected to gas supply system 108. A flexible gasket system may be provided for making the connections 230 or flexible hoses could be provided between connections 230 to provide a pressure sealed system.

FIGS. 3a, 3b, and 3c are plan views of another design for the signal injection module 106 of FIG. 2 showing the layout of components in more detail. Figure 3a is an end view, FIG. 3b is a side sectional view, and FIG. 3c is a top view of this embodiment of module 106.

Referring in particular to FIG. 3b, dielectric spacers 302 are provided to form a compartment about toroidal ferrite core 212 and prevent shorts or discharges. Spark gap switch 218 is connected through capacitor 304 and trigger isolation component 219 to connector 226. Capacitors 216 are connected through lead 309 and resistor 308 to another terminal of the same connector 226 to which positive high voltage power will be applied during operation, and are also connected by lead 309 to spark gap switch 218. Capacitors 216 will be connected by another lead (not shown) to a negative or ground terminal of the high voltage power source. A gas inlet tube 310 having a valve (such as a ball check valve) to maintain pressure is connected to provide pressurized gas to spark gap switch 218, and a gas outlet tube 312 also having a valve is provided for the removal or circulation of gas. Gas inlet tube 310 and gas outlet tube 312 are brought to the outside of housing 202 in a connection 230.

Figure 4:
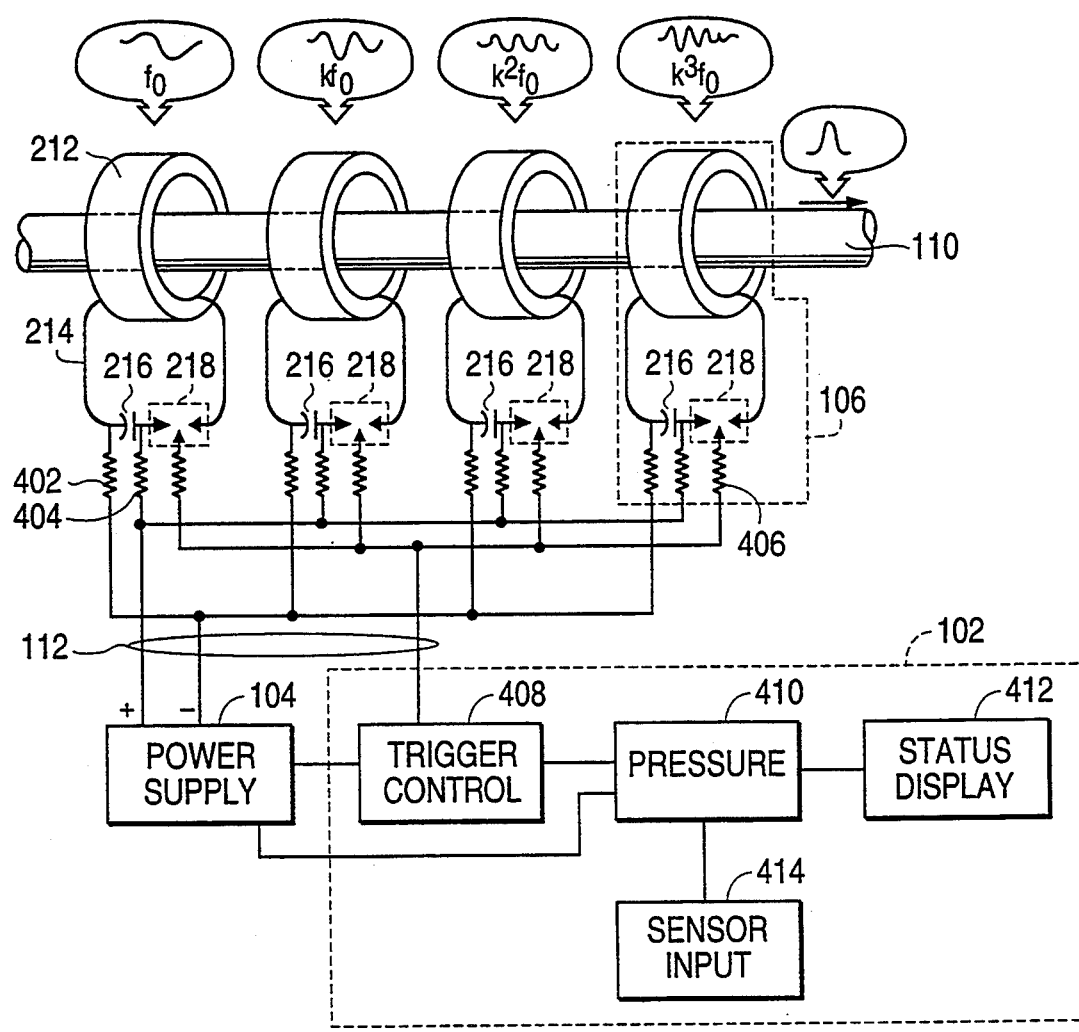
FIG. 4 is a schematic diagram showing the connections of a high voltage power supply and trigger supply to the coils of the modular signal injection units.

FIG. 4 is a circuit diagram showing a system according to the present invention having multiple tuned circuit output modules. Four injector modules 106 are shown in this example. As illustrated in the drawing Figure, the injector modules 106 are connected to power supply 104 and control unit 102, which includes trigger control 408, processor 410, status display 412, and sensor inputs 414. The trigger control 408 and processor 410 are connected to power supply 104, and the status display 412 and sensor inputs 414 are connected to processor 410.

Trigger control 408 is preferably a model PT-55 manufactured by Pacific Atlantic Corporation of El Cerrito, Calif., which includes a pulse amplifier circuit so that individual amplifiers are not needed in the injector modules 106.

It should also be noted that, as described previously, spark gap switches 218 are connected to a source of pressurized insulating gas which is also connected to the processor 410 to report status to and receive control signals therefrom, but the gas system is omitted from FIG. 4 for clarity.

Processor 410 is preferably a programmable general purpose digital computer system with a screen or other status display 412. For example, processor 410 may be an Apple Macintosh (TM) computer. Such computers include a microprocessing system, permanent storage devices such as disk drives, and input and output devices. The input and output devices include at least a graphics display screen which forms status display 412, a keyboard, and a pointing and selection device such as a mouse, trackball, touchscreen, or the equivalent. Processor 410 is preferably provided with an interface to a standardized interconnection bus, such as an IEEE standard VMI or VXI bus. The processor 410 preferably controls and directs the complete operation of the injection system 100 using software designed to provide the functions described herein. The other components of the system, such as power supply 104, trigger control 408, and sensor inputs 414, will preferably be connected to processor 410 through this standardized bus for control, communication, and status monitoring in a known manner. Sensor inputs 414 may be any desired sensing circuits for monitoring parameters during the course of a test. Specifically, sensor inputs 414 may include sensors for monitoring operation of the system 100 according to the present invention, or may also include sensors for monitoring the system under test which includes component 110. Preferably, sensor inputs 414 may include digitizing oscilloscope 103 which can be used to monitor the response of the system under test to the current generated by the system.

High voltage power supply 104 is connected through cable 112 to resistors 402 and 404 respectively which are provided in each injector module 106, and thus across each of the capacitors 216 of injector modules 106. High voltage power supply 104 preferably provides a selectably variable output voltage of up to 100 kilovolts to charge capacitors 216. A suitable power supply is a 0 to 100 Kilovolt supply, model number RLPS100-100P sold by Dell Electronics of Mount Vernon, N.Y. The charge voltage level and the charge rate will be computer controlled by control unit 102. Primary windings 214 are connected through resistors 402 to the negative terminal of high voltage power supply 104. The terminals of capacitors 216 connected to the positive terminal of high voltage power supply 104 are each also connected respectively to a first of two switching terminals of spark gap switches 218, with the second of the two switching terminals connected to the opposite ends of the primary windings 214. A trigger terminal of each spark gap switch 218 is connected through a resistor 406 and trigger isolation component 219 to trigger control 408.

For a double exponential output, the fundamental frequencies of injector modules 106 is a power series based on a constant k. The designed fundamental output frequency of each injector module 106 is $k^{i-1}f_0$ where i is the number of the coil (i=1, 2, 3 ... n) and $f_0$ is the desired fundamental frequency of the first injector module 106. In a preferred embodiment there may be n=6 injector modules 106 and $f_0$ may be 3 MHz. Analysis has shown that values of k between 1.5 and 2.0 will provide the desired double exponential secondary response described above. Therefore, with k chosen to be 1.5, the fundamental frequencies of the injector modules 106 in this embodiment will be 3, 4.4, 6.7, 10, 15, and 22.2 Mhz.

These frequencies can be obtained by varying combinations of capacitors 216, toroidal ferrite cores 212, and winding turns. Specifically, the frequencies of the modules are a function of the capacitance of the capacitor or capacitors, the inductance of the core, and the number of windings on the core. Core material selection is performed by comparing the desired resonant frequency of the module to the manufacturer's recommended application frequency range for each type of core material. The core winding, spark gap, and capacitor act as a tuned series circuit with a nominal resonant frequency $f_0$ given by:

$$f_0 = 1/(2\pi(LC)^{\frac{1}{2}})$$

where L is the primary winding inductance of the ferrite core coupler and C is the capacitance of the high voltage capacitor. An inductance factor $A_L$ can be obtained from manufacturer's data or calculated from the core dimensions and electrical properties of the material in a known manner for the particular ferrite core and winding geometry. The inductance of the primary winding is determined from this inductance factor $A_L$ as follows:

$$L = N^2 A_L / P$$

where N is the number of turns on each core and P is the number of cores in parallel. Using these equations and by referring to manufacturer's data, a variety of core, winding, and capacitor combinations can be derived to obtain a desired fundamental frequency for a module.

Capacitors can be obtained from High Energy Corporation of Parkesburg, Pa., and the toroid cores can be obtained from Palomar Engineering of Escondido, Calif. or Amidon Associates of Dominguez Hills, Calif.

As a design example, a prototype was constructed in which three modules were provided. Three modules were provided, each constructed using three cores, Part No. 61, wound in parallel with one turn each to form a single module toroid. A capacitor of 5400 pF was used with the first module to obtain a fundamental frequency of 5.3 Mhz. A capacitor of 2700 pF was used with the second module to provide a fundamental frequency of 8 Mhz, and a capacitor of 1350 pF was used in the third module to provide $f_0 = 12$ Mhz. The combination of these three modules produces a double exponential output, but with a more narrow pulse than the preferred fundamental frequency combination described previously.

While the modules can be constructed to have a specific fixed fundamental frequency as described, it may also be highly desirable to make the modules with modular or adjustable components. For example, the capacitors or cores as shown could be installed using connectors so that they are easily disconnected and replaced to allow configuration of the module for multiple frequencies. Or, the modules could incorporate variable units or units with switches to add or subtract capacitance or inductance to thereby reconfigure the output of the module. To permit this reconfiguration, it may be particularly desirable to select a core and winding design which can be used with a plurality of available capacitors to produce different fundamental frequencies, such as the prototype design described previously in which only the capacitors vary between modules.

In operation, the low inductance stored energy capacitors 216 are charged to a specified voltage through low loss cable 112 from high voltage power supply 104. A trigger pulse sent from control unit 102 triggers the spark gap switches 218 in each injector module 106. The triggered spark gap switches 218 then conduct the electrical energy stored in the charged capacitors 216 to the waveshaping circuits of the injector module 106. The primary components of these tuned waveshaping circuits are the primary windings 214, toroidal ferrite core 212, and capacitors 216, but the waveshaping circuit may comprise additional capacitors and resistors as is known in the art if required to produce a desired waveform. A tailored waveform is generated in the test cable that is a composite waveform created by the synchronous injection of all the waveforms from each module.

Figure 5A:
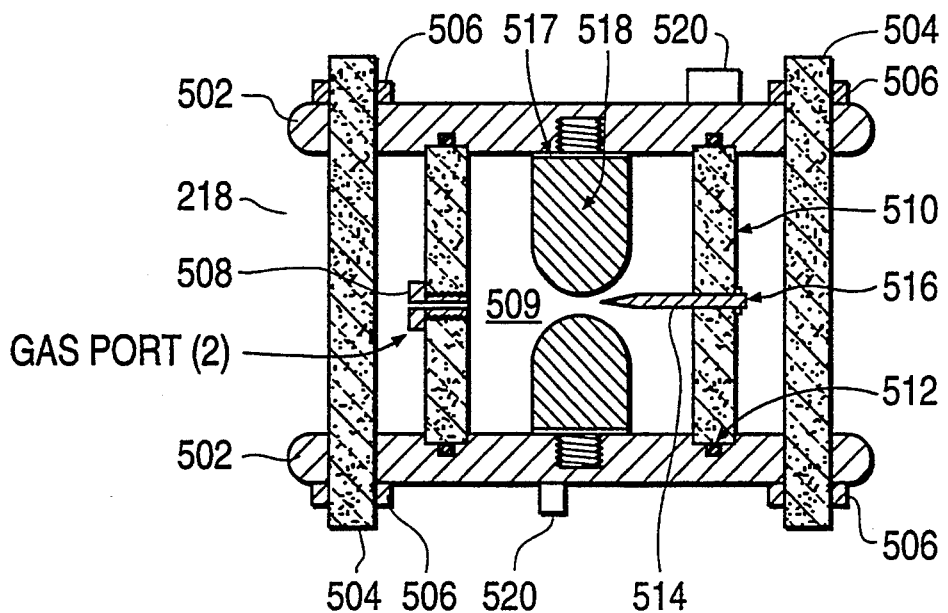
FIGS. 5a and 5b are side sectional and top views of a spark gap switch useful in constructing the present invention.
Figure 5B:
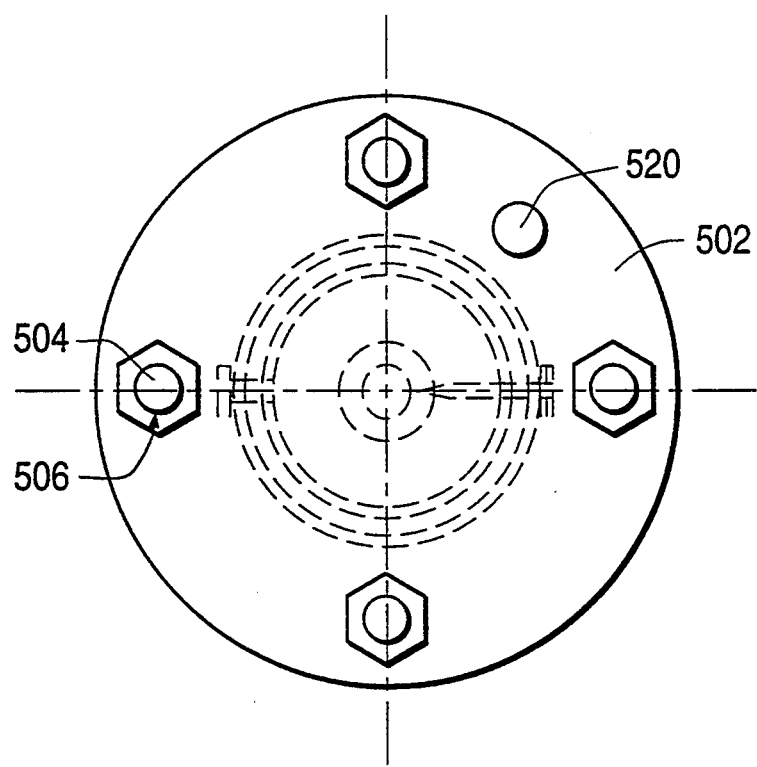

FIGS. 5a and 5b are a side sectional and top view respectively of a preferred design for the spark gap switch 218 used in the present invention. Referring to FIG. 5a, the spark gap switch 218 is constructed using two end plates 502 connected by four dielectric threaded rods 504 held in place by eight nuts 506. A dielectric cylinder 510 surrounds the spark gap region 509 and is sealed to end plates 502 by O-rings 512 at each end. A trigger electrode 514 extends through dielectric cylinder 510 into spark gap region 509 and has a terminal 516 for connection to a trigger source. Similarly, gas port 508 extends through dielectric cylinder 510 to communicate with spark gap region 509. Anodes 518 are connected through adjustment shims 517 to each of the end plates 502. Thus, anodes 518 extend into and define the spark gap region 509. Terminals 520 are provided on each end plate 502 for connection of a large voltage source across the spark gap switch 218. End plates 502, shims 517, and anodes 518 are preferably constructed of stainless steel. In operation, the spark gap region 509 is filled with pressurized gas to increase resistance to arcing. A large voltage is applied to one anode 518, creating a potential difference with the other anode 518. A trigger voltage may then be applied to terminal 516 to cause breakdown of the spark gap and conductance of the supplied voltage across anodes 518.

The preferred embodiment of control unit 102 will now be described in detail with reference again to FIG. 4. In this embodiment, processor 410 of control unit 102 is provided with software which allows the operator to selectively control and monitor the high voltage charging cycle, trigger the injection modules, and shut down the high voltage circuits. This software will also provide fully automated (or optionally manually operated) testing and may use virtual instrumentation and hypermedia technology to enhance control and monitoring functions. The operator may specify the desired output characteristics, input or recall test setup parameters, monitor system performance, and display help functions and test specifications, and the system will preferably self-generate operation logs and permanent data documents.

In particular, control unit 102 is preferably designed to provide substantial and useful assistance to the system operator in conducting tests and recording and analyzing results. In particular, control unit 102 may have software designed to help an operator avoid problems that might be encountered during a test, thus producing error-free test results. Some typical problems that might be encountered during a test include: planning problems such as lack of knowledge of previous results, setup or calibration problems resulting from insufficient or incorrect information, test conduct errors such as improper settings or timings of instruments, and quality control problems. Other problems include archiving problems (e.g. loss of complete information on setups and test results), analysis problems caused by incompatible formats or processors between different analysis systems, and incorrect conclusions caused by undetected variables. Any one of these problems can have a devastating effect on the integrity of the test results.

Intelligent instrumentation as defined herein is particularly useful in avoiding these problems. The goal of this "intelligent instrumentation" is to significantly reduce the likelihood of costly test conduct/diagnostic problems and to compensate for different skill levels among users, thus enhancing repeatability and accuracy of results. Thus, the intelligent instrument according to the present invention will assist the technician in each of the phases of a test effort and help to minimize the occurrence of time consuming or data corrupting problems. A major objective is to provide the user with the information and knowledge needed to perform a successful test with minimum effort on the part of the user. The instrumentation provided is utilized in most if not all of the phases of a test from planning through analysis and reporting, and not merely during the data acquisition portion of the test.

Preferably, the software executed by processor 410 of control unit 102 uses hypermedia and virtual systems as a foundation for the user interface, and software such as expert system software to incorporate knowledge into the instrumentation. Integration of other software technologies, particularly smart databases, is also desirable to enhance the analytical and information retrieval capability of the intelligent instrument. Advanced hardware, including digital signal processors, VXI bus instruments and digital sampling oscilloscope 103, may be connected in the system according to the present invention, and this hardware makes it possible to implement the intelligent instrument system effectively.

An intelligent instrumentation system useful in Mil-Std 188-125 Pulse Current Injection (PCI) testing will be described as a preferred example of software provided for the control unit 102. This standard applies to critical military communication facilities and requires transient pulse testing to demonstrate the ability of the facility to operate in the harsh electromagnetic environment produced by nuclear detonations. The software described herein is preferably implemented on an Apple Macintosh (TM) computer, using an IEEE-488 interface card to connect to digitizing oscilloscope 103. The software architecture design of the intelligent instrument preferably integrates hypermedia, an expert tool, virtual instruments and a database. For example, the following commercial software packages could be used as components of the system: Hypermedia functions may be provided using Supercard (TM), available from Silicon Beach Software; expert system functions may be provided using Entry Pac (TM), available from Albathion Software, Inc., database functions may be provided using OMNIS 5 (TM) available from Blyth Software, and virtual instrument functions may be provided using LabView 2.2 (TM) available from National Instruments.

Preferably, processor 410 operates in a mode wherein multiple windows are present on the screen or status display 412, and different functions can be performed in each of the windows. An overall control program may be provided to selectively activate individual operating subprograms, including the database, expert system program, hypermedia display program, and analysis program, and to provide data transfer between the subprograms. Examples of functions which may be provided are listed in Table 1, along with an indication of the subprogram which can be used to provide the function.

TABLE 1

| FUNCTION | TECHNOLOGIES USED TO IMPLEMENT |
| --- | --- |
| On-line Display of Test Record Document | Hypermedia |
| Expert Test Requirement Assistance | Hypermedia/Expert Tool |
| Automated Test Setup/ Analysis/Verification | Hypermedia/Database/Expert Tool |
| Enhanced Instrument Interface (Help Function) | Virtual Instrument/ Hypermedia/Expert Tool |
| Data Analysis (Waveform Norms) | Virtual Instrument/ Hypermedia |
| Pass/Fail Decision Advice | Hypermedia/Expert Tool |
| Measurement Archival/ Retrieval | Hypermedia/Database/ Expert Tool |

Figure 6:
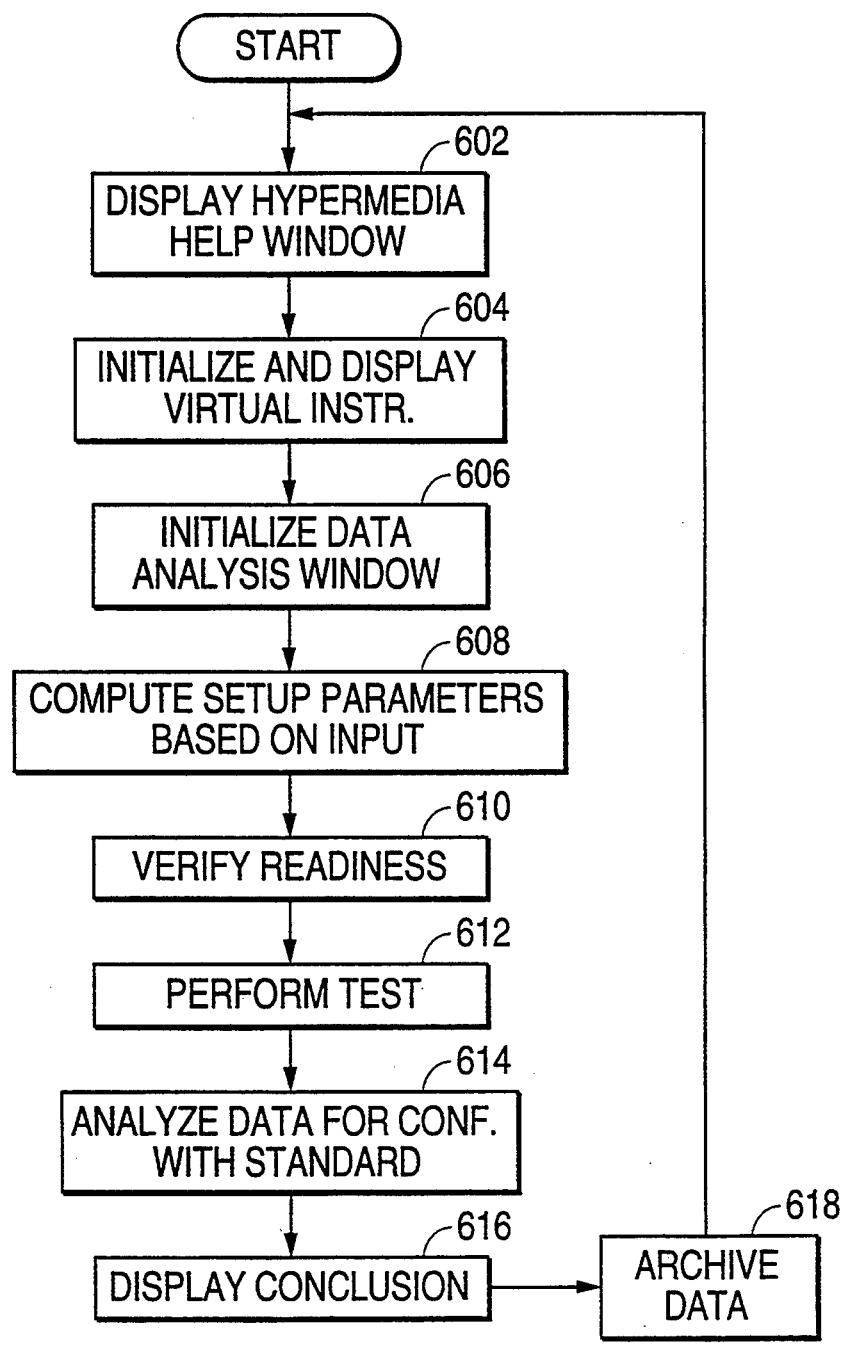
FIG. 6 is a flowchart showing functions of the software of the present invention during completion of a test.

The preferred embodiment of the intelligent instrument for MIL-STD 188-125 PCI testing provides expert assistance and improved functionality for the user in each testing phase. FIG. 6 is a flowchart of the general software functions of the intelligent instrument according to the preferred embodiment of the present invention. When the system is activated, a hypermedia help and information window is activated as shown in block 602. A "virtual instrument" display simulates desired instrumentation, such as the display output of a conventional oscilloscope using sampling data provided by digitizing oscilloscope 103, thus allowing the operator to view the results of the test in real time. This virtual instrumentation is initialized and displayed as shown in block 604, and the data analysis subprogram is initialized with its window as shown in block 606. To assist in the planning stage of the test, an on-line standards document is readily available in the hypermedia help window to assist the user in determining the test requirements depending on the system or subsystem under test. The document is displayed in hypermedia, i.e. using a hypertext program, with non-linear navigation features to permit display of any desired part of the document and thereby adapt to the various skill levels of the users.

An expert system software package, programmed with rules for the test derived from the testing specifications, is provided to assist in operator interpretation of the standard. This expert "consultant" guarantees uniformity in the application of the standard and increases test quality across multiple users and different systems under test.

As an aid to the setup and calibration stage of the test, the intelligent instrument will automatically compute the settings needed to record the expected response, using rules programmed into expert system software and based on user responses to questions regarding probes to be used, etc. as shown in block 608. Specifically, the military specification noted above requires recording of transient fast risetime and high amplitude waveforms. The input levels will vary depending on the system under test, the location of the test probe, and the type of probe. The apparatus will determine the proper range settings for the digitizing oscilloscope 103 and other test monitoring equipment based on a minimum amount of operator input using rules programmed into the expert system. The intelligent instrument database maintains information on probe calibration factors and equipment calibration records. Warnings about uncalibrated or out-of-calibration equipment are provided to the user prior to actual testing, and the system verifies readiness and proper setup, as shown in block 610, by sensing the connection of components and/or by inquiries to the operator. This verification function that results in a simple yes/no confirmation of the correctness of the instrument settings.

Additional help tools provided include an analysis function that shows the user the limitations (maximum and minimum amplitudes and rise times) of the instrument.

During the data acquisition stage of the test, as shown in block 612, the intelligent instrument provides computer controlled transfer of data and enhanced display capability. Incoming collected data can be displayed using a virtual instrument display on status display 412 (shown in FIG. 4), while at the same time other information, including operator test instructions, is displayed in other windows. Information can be displayed in individual sector windows or superimposed on other displayed information.

Analysis functions are preferably performed in real time by the system as shown in block 614. The MIL standard used as the example in the preferred embodiment requires the computation of complex functions, called waveform norms, using the measured data as an input. The intelligent instrument performs the required calculation of the norms as data sets are collected, or optionally on the archived data sets. Real time analysis helps eliminate the need to go back and repeat portions of the test at a later date due to inconsistencies or errors identified during data analysis.

Finally, the system reaches conclusions about the test results and provides these conclusions to the operator during the actual test as shown in block 616. The standard contains a pass/fail criteria for the testing that is dependent on the portion of the system under test and the status of system. The pass/fail conclusions are developed from a correlation of the results of the analysis phase with the specified allowable limits. The intelligent instrument provides the user with on-line help in the hypermedia window for interpreting the test results, and the expert system clearly and simply displays the pass or fail conclusion. The conclusions and intermediate displays can also be printed on an attached printer or from archived files for inclusion in a required test conduct report.

Finally, the intelligent instrument uses a database subprogram as shown in block 618 to fully record all of the instrument settings and identification information for each test, as well as the collected data. The instrument preferably also supports the integration of photographic records along with the digital data and log sheets. In this manner, a complete record of each test is stored on a disk or other mass storage device for retrieval at will. Upon completion of a test, the system resets itself to permit conduct of additional tests or analysis of data from tests already conducted.

Figure 7A:
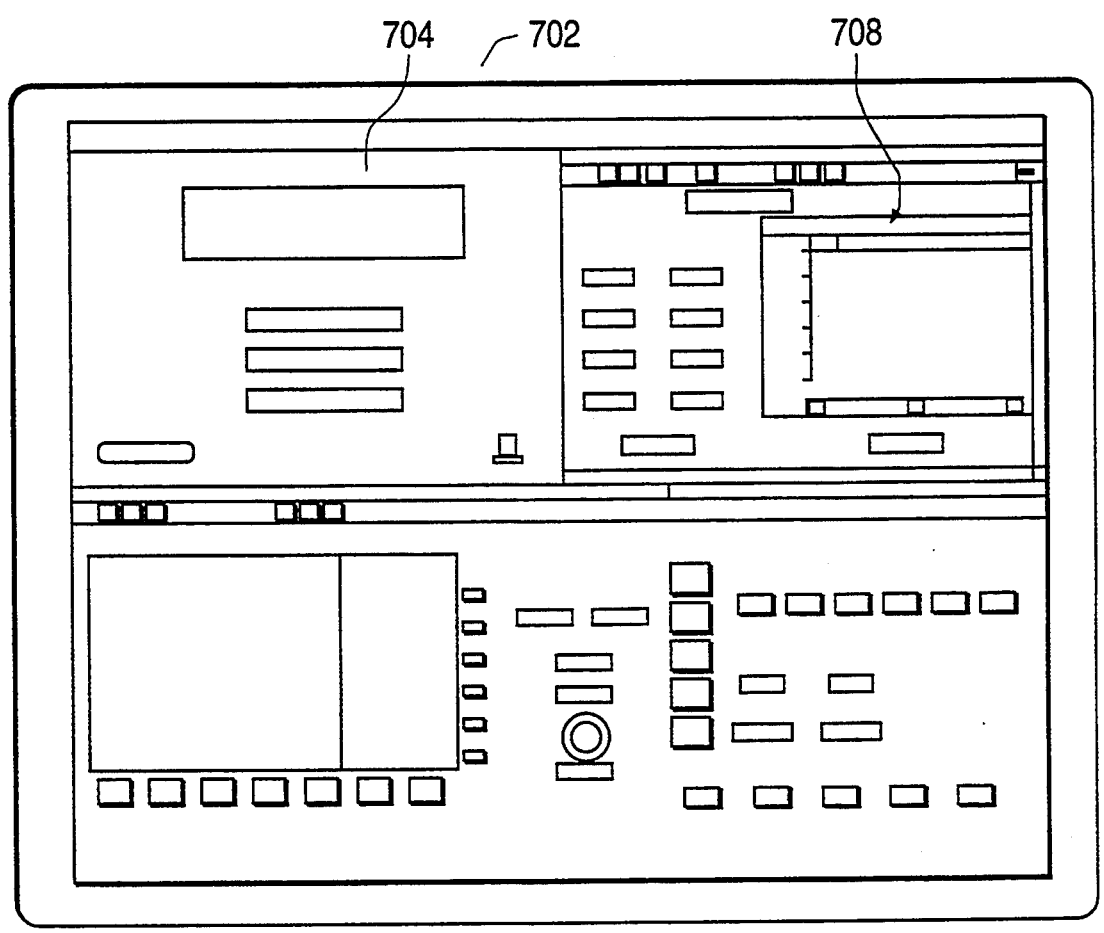
FIGS. 7a through 7g show screen displays provided by the software of the present invention during test operation.

The operation of this software in processor 410 of control unit 102 will now be further described with reference to FIGS. 7a through 7g, which show the screen display 702 of status display 412 during different test functions. The preferred initial front panel display of the instrument is shown in FIG. 7a. The hypermedia function, seen in the upper left hand corner 704 of the display, gives the operator a visual readout of the standard being tested and to the other features of the intelligent instrument. A virtual (i.e. computer display simulated) oscilloscope is at the bottom section 706, and the analysis function is displayed in the upper right section 708. Thus, a real-time graphic readout of test data, text related to the test, and a test result analyzer are all located on the same display and available to the operator at all times during the test.

Figure 7B:
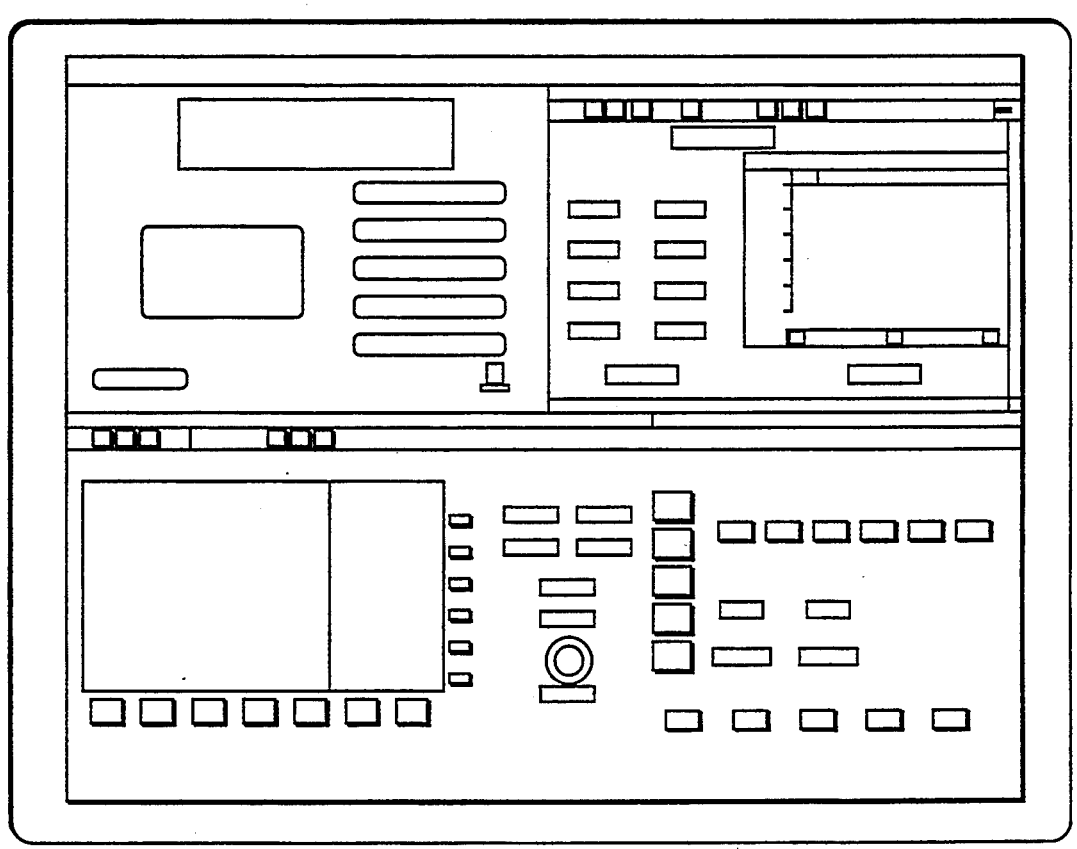

Clicking a pointing device associated with the computer on the bar labeled "Table of Contents" in upper left hand corner 704 causes the display to change as shown in FIG. 7b. Icons are displayed in upper left hand corner 704 to match the Table of Contents from the testing standard. By selecting a desired one of these icons, the user is able to view the selected portion of the standard. "Navigation aids" are provided on each of the screens to show where in the standard the displayed portion is located. The information in the standard may be accessed linearly (front to back) or non-linearly (by skipping sections or recalling information from another section).

Figure 7C:
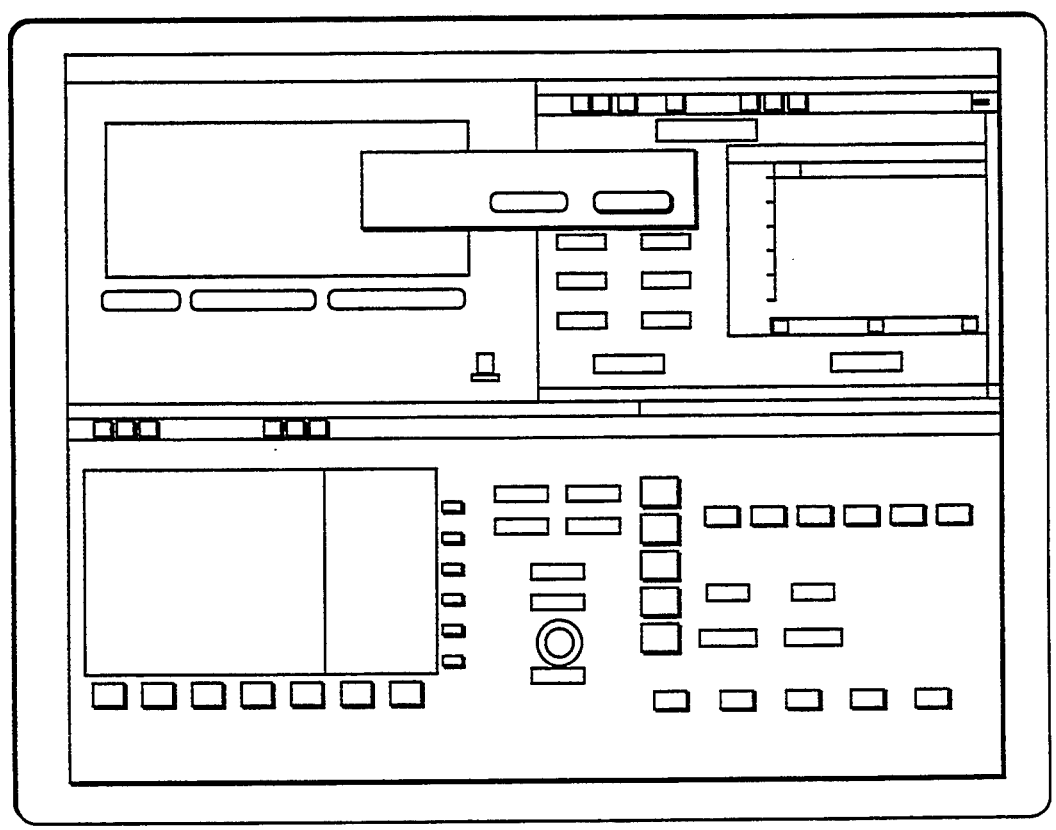
Figure 7D:
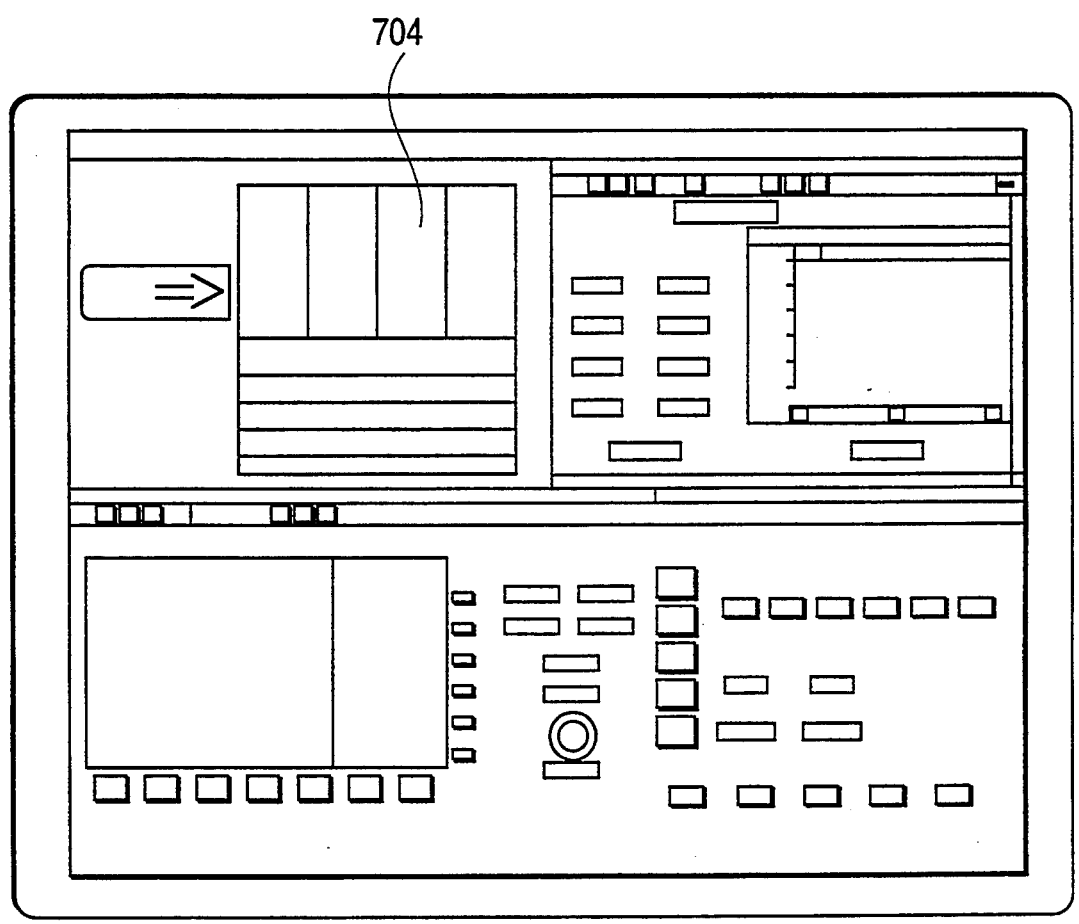

FIG. 7c shows a display of text from the detailed test requirement section. This display could be obtained by selecting the Maximum Injection Levels section of the test requirements from the Table of Contents. Help functions are provided which are interactive and context-sensitive. In FIG. 7c, such a help function is shown in the form of a question box overlaid on top of the test and the analysis window. This question asks the user if he or she wants expert assistance in determining the test requirements. Answering "yes" causes the expert software provided to initiate a series of questions to determine the nature of the system under test. These questions may be provided in graphical form as shown in FIG. 7d. In the example of FIG. 7d, the user is asked to specify the type of antenna used in the system. The graphic allows the user to select according to classes of antennae (Medium Frequency, High Frequency, etc.) from the standard, or else specify the actual operating frequency or wavelength of the antenna. The expert system requires only that the user provide any combination of information adequate to specify the nature of the system under test. When the expert tool has obtained sufficient information on the system under test, it provides the user with a detailed description of the testing that must be performed and does not ask further questions.

Figure 7E:
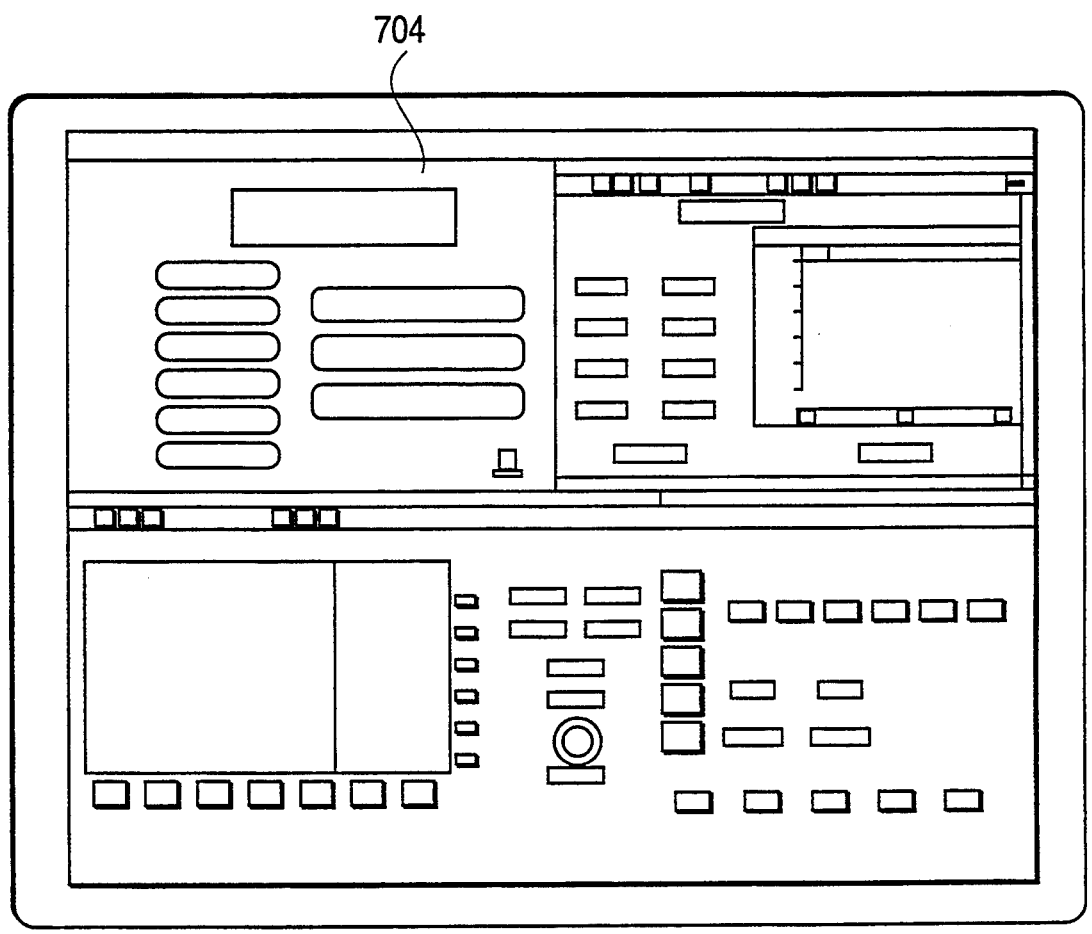
Figure 7F:
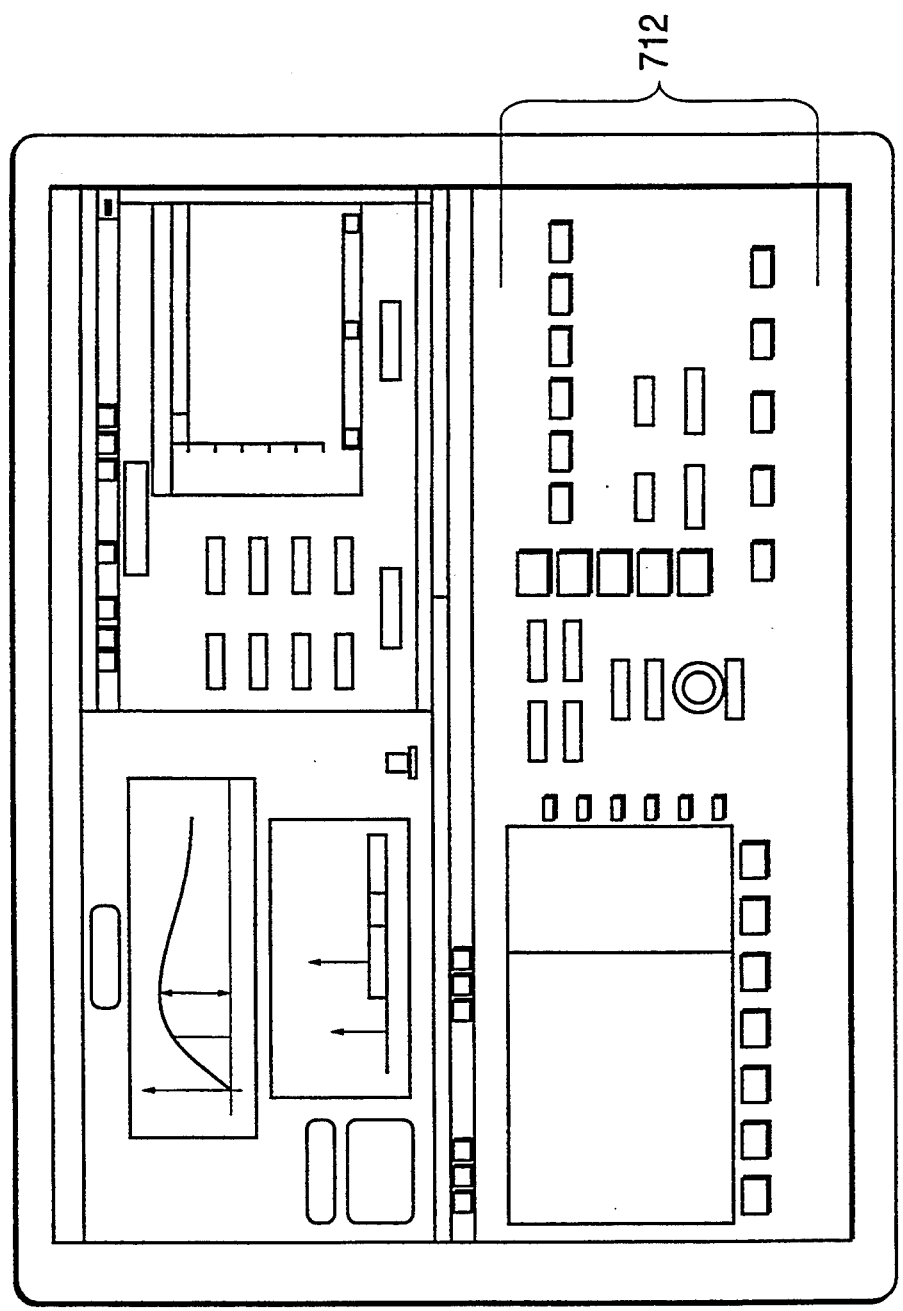

When the intelligent instrument is in the Data Acquisition mode, the hypermedia window in upper left hand corner 704 becomes an on-line help function as shown in FIG. 7e. For example, by clicking the pointing device on a "Scope Help" button displayed on the virtual instrument in section 706 of the display, the operator may access the user manual of digitizing oscilloscope 103. The Table of Contents of the manual is displayed in FIG. 7e. Selecting the appropriate section of the manual provides the user with detailed information on the oscilloscope 103. Thus, the intelligent instrument adjusts the information support functions provided depending on the phase of the test to provide context-sensitive help.

Several other on-line help functions are also provided. If the operator has adjusted the settings of the oscilloscope 103 and would like to know what those settings mean in terms of the data acquisition capability, pressing the "Analyze Set-up" button on the virtual instrument (by clicking the pointing device on the display area so designated) produces the graphic display shown in FIG. 7f. The analysis function displays the capability of the instrumentation (digitizer, data link and probe) using a typical waveform associated with PCI testing. The waveform shows the operator key data collection information such as the maximum and minimum resolution, risetime and pulse duration that can be recorded. The lower portion of the figure displays information on the timing of the data acquisition and the pulse power source. The ability to provide information to the user in a form that is familiar and consistent is an important aspect in design of the intelligent instrument according to the present invention.

The virtual instrument panel mimics the operation of the actual hardware interface. This includes the "soft" or context sensitive key structure next to the virtual instrument output display 710 and the dedicated simulated function keys 712 illustrated to the right of the display 710. In each case, these "buttons" or "keys" provide a simulated instrument control panel and can be activated using the pointing device provided with the computer system implementing the virtual instrument.

Figure 7G:
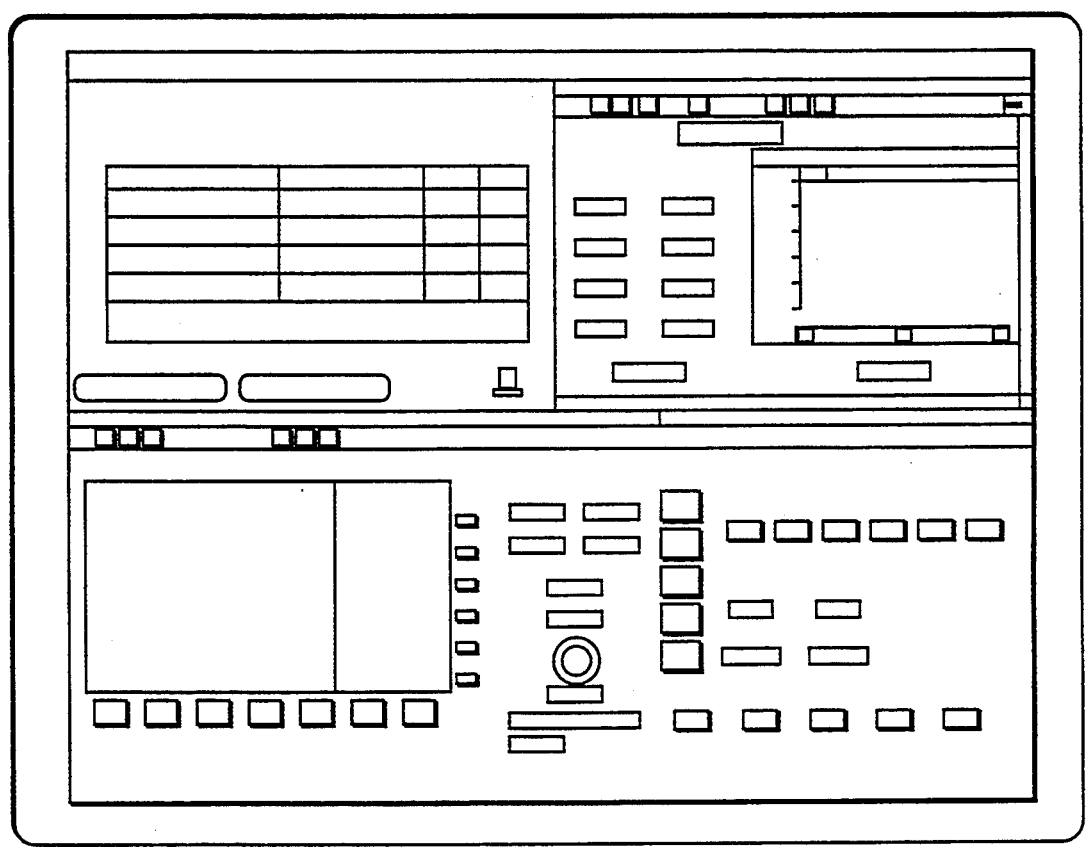

The final view of the intelligent instrument, FIG. 7g, shows a display which may be provided after the data is collected and analyzed. A simple calibration signal is recorded on one channel of oscilloscope 103. Then, the data analysis function is used to calculate waveform norms as shown. An archived data record may be recalled and displayed next to the waveform norm calculations (upper right). As mentioned earlier, the standard requires comparison of the waveform norms with strict limits that depend on the configuration of the system under test. Therefore, an expert-system generated Pass/Fail Decision function is also provided by applying the rules of the test to the available input information as shown in the upper left portion of FIG. 7g. The Pass/Fail Decision support function shows the required limits, the waveform norms calculated from the archived data and the results of the Pass/Fail decisions. The Pass/Fail Decision support screen (and all of the other views) may be printed out as a permanent record if desired, or stored in electronic form.

Thus, a complete and useful system for testing the response of systems to an input pulse has been disclosed.

We claim:

1. An apparatus for injecting simulated interference signals into a component of a system under test, comprising:

signal generation means for electromagnetically introducing a predetermined high power waveform in the component of the system under test, said signal generating means comprising a plurality of modular inductive units each inductively coupled to the system under test in parallel, each modular unit activatable by an input signal applied to a control input thereof to generate a predetermined output function, where at least two said modular inductive units generate output functions with differing frequency components, and where said generated output functions of said plurality of units combine to produce said simulated interference signal to induce said predetermined high power waveform in said component of the system under test; and control means connected to said control input of said units for simultaneously activating said plurality of inductive devices to inject said combined simulated interference signal into said system under test.

2. The apparatus of claim 1 further comprising monitoring means connected to said system under test for recording the response of said system under test to said simulated interference signal.

3. The apparatus of claim 2 wherein said monitoring means comprises a computer with software for performing said recording function.

4. The apparatus of claim 3 wherein said computer also forms at least a part of said control means and functions both to initiate the test and to monitor test results.

5. The apparatus of claim 3 wherein said computer provides on-line assistance and instructions to the operator for completing the test according to a predetermined test specification.

6. The apparatus of claim 3 wherein said computer provides a multiple window screen display of information useful to the operator.

7. The apparatus of claim 6 wherein said computer uses hypermedia and virtual instrument functions to simultaneously display on a single screen test results and a textual specification of the test.

8. The apparatus of claim 3 wherein said computer is provided with expert system software programmed with rules for testing according to a predetermined specification to assist the operator in setting up and conducting a test.

9. The apparatus of claim 1 wherein said modular units each have a separate inductive coupling mechanism for coupling the unit to the system under test.

10. The apparatus of claim 9 wherein said modular signal injection units comprise a toroidal component which opens for coupling about said component of the system under test without disturbing the operation of the system under test.

11. The apparatus of claim 9 wherein said control system comprises a computer-controlled trigger system providing simultaneous triggering of the modules.

12. The apparatus of claim 1 wherein each modular signal injection unit comprising a toroidal coil with a winding, said signal generating means further comprising power storage means and a high power switch triggerable to discharge said power storage means into said windings to produce a field in said toroidal coil.

13. The apparatus of claim 12 wherein said high power switch is a spark gap switch.

14. The apparatus of claim 13 wherein each modular signal injection unit has power storage means and a spark gap switch.

15. The apparatus of claim 14 wherein a pressurized gas system is connected to each of said spark gap switches to increase the breakdown voltage level of said switches.

16. The apparatus of claim 14 wherein said power storage means comprises at least one power capacitor.

17. The apparatus of claim 12 wherein said modular signal injection units are provided with mating connectors by which a plurality of said modular signal injection units are interlocked to simultaneously inject signals into the same component of the system under test.

18. The apparatus of claim 17 wherein said connectors make a connection to each modular signal injection unit of a common trigger signal of said control means, whereby the output of each said modular signal injection unit is triggered simultaneously to produce a composite simulated interference signal.

19. The apparatus of claim 12 wherein said toroidal coils are hinged and open to receive said component of said system under test in the center of the toroid, and are thereafter closed to form a completed magnetic circuit, a field from which will induce a current in said component of said system under test.

20. The apparatus of claim 12 wherein said modular signal injection units are tuned to produce a sinusoidal output at a predetermined frequency.

21. The apparatus of claim 20 wherein a plurality of said modular signal injection units are provided to produce a double exponential output.

22. The apparatus of claim 1 wherein said modular signal injection units have mating connectors connecting each modular signal injection unit to an adjacent modular signal injection unit.

23. The apparatus of claim 22 wherein said connectors connect said control inputs of said adjacent modular signal injection units.

24. The apparatus of claim 23 wherein said connectors connect external power inputs of said adjacent modular signal injection units.

25. A method of testing the resistance of a system under test to injected interference signals, comprising the steps of:

providing a computer system, a plurality of modular signal injection units that generate individual injection signals, and a response sensing means for sensing the response of the system under test to injected interference signals, where at least two of the modular signal injection units generate predetermined injection signals with differing frequency components;

inductively coupling the modular signal injection units in parallel to a component of the system under test;

activating the modular signal injection units at the same time to inject a predetermined signal into the system under test, so that the injection signals of the individual modular signal injection units combine to inject said predetermined signal into said component of the system under test automatically collecting data upon activation of the modular signal injection units, using the computer system and the response sensing means, said data defining the response of the system under test to the injected signals; and automatically analyzing the data, using the computer system, relative to a predetermined performance standard to produce an output indicating whether the response of the system under test to the injected signal meets the predetermined performance standard.

26. The method of claim 25 wherein the computer system provides a multiple window display during the test of information useful to the operator in conducting the test.

27. The method of claim 26 wherein the computer system uses hypertext functions to selectively display test specifications.

28. The method of claim 26 wherein the computer system uses hypertext functions to selectively display predetermined operating instructions for the test system.

29. The method of claim 25 wherein the computer system uses a virtual instrumentation display to provide test data to the operator.

30. The method of claim 29 wherein a digitizing oscilloscope is provided, connected to the computer system and the system under test, and the oscilloscope output is displayed in virtual form to show the response of the system under test.

31. The method of claim 25 wherein expert system software operates on the computer system and is programmed with rules for testing according to a predetermined testing specification to assist the operator in setting up and conducting a test.

32. The method of claim 31 wherein the expert system software automatically provides appropriate calibration information for probes associated with the oscilloscope.

33. The method of claim 31 wherein the expert system software determines test requirements based on any of a plurality of information sets supplied by the operator, each said set consisting of a different minimal definition of the characteristics of the system under test.

34. The method of claim 25 wherein software in the computer automatically provides and displays a pass-fail conclusion for the system under test.

35. The method of claim 25 wherein the computer system stores test setup information and results in a database for later retrieval and review.

36. The method of claim 25 wherein a plurality of said modular signal injection units are provided, each comprising a toroidal coil with a winding, and there is further provided power storage means and a high power switch triggerable to discharge said power storage means into said windings to produce a field in said toroidal coil.

37. The method of claim 36 wherein said high power switch is a spark gap switch.

38. The method of claim 37 wherein each modular signal injection unit has power storage means and a spark gap switch.

39. The method of claim 38 further comprising the step of providing a pressurized gas system connected to each of said spark gap switches to increase the breakdown voltage level of said switches.

40. The method of claim 38 wherein said power storage means comprises at least one power capacitor.

41. The method of claim 36 wherein said modular signal injection units are provided with mating connectors by which a plurality of said modular signal injection units are interlocked to simultaneously inject signals into the same component of the system under test.

42. The method of claim 41 further comprising the step of connecting said connectors of each modular signal injection unit to receive a common trigger signal, whereby the output of each said modular signal injection unit is triggered simultaneously to produce a composite simulated interference signal output.

43. The method of claim 36 wherein said toroidal coils are provided with hinge means for permitting opening of the coils, comprising the further steps of:
   opening said coil to receive said component of said system under test in the center of the toroid; and
   subsequently closing said coil to form a completed magnetic circuit, a field from which induces a current in said component of said system under test.

44. The apparatus of claim 36 wherein said modular signal injection units are tuned to produce a sinusoidal output at a predetermined frequency.

45. The apparatus of claim 44 wherein a plurality of said modular signal injection units are provided to produce a double exponential output.

46. An apparatus for injecting simulated interference signals into a component of a system under test, comprising:
   signal generation means for electromagnetically introducing a predetermined high power waveform in the component of the system under test, said signal generating means comprising a plurality of modular inductive units each coupled to the system under test, and activatable by an input signal applied to a control input thereof to generate a predetermined output function, where said generated output functions of said plurality of units combine to produce said simulated interference signal to induce said predetermined high power waveform in the component of the system under test; and
   control means connected to said control inputs of said units for simultaneously activating said plurality of inductive devices to inject said combined simulated interference signal into said system under test,
   wherein there are n modular signal injection units $i=1$ to n, each producing as an output a sinusoidal signal at a frequency equal to $k^{i-1}f_0$, where i is the number of the modular signal injection unit, $f_0$ is a base output frequency of the first modular signal injection unit, and k is a constant.

47. The apparatus of claim 46 wherein the value of k is between 1.5 and 2.

48. The apparatus of claim 47 wherein $n=6$ and $f_0$ is 3 MHz.

* * * * *